(12) United States Patent
Kim et al.

(10) Patent No.: US 8,435,884 B2
(45) Date of Patent: May 7, 2013

(54) METHOD FOR FORMING AN INTERCONNECT STRUCTURE

(75) Inventors: Ryoung-Han Kim, Clifton Park, NY (US); Matthew E. Colburn, Schenectedy, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 282 days.

(21) Appl. No.: 12/876,510

(22) Filed: Sep. 7, 2010

(65) Prior Publication Data

US 2012/0058640 A1    Mar. 8, 2012

(51) Int. Cl.
*H01L 21/308* (2006.01)
*H01L 21/768* (2006.01)

(52) U.S. Cl.
USPC ..... 438/637; 438/700; 438/738; 257/E21.577

(58) Field of Classification Search .......... 438/637, 438/700–702, 734–738; 257/E21.575, E21.577, 257/E21.023
See application file for complete search history.

(56) References Cited

U.S. PATENT DOCUMENTS

2008/0070165 A1 * 3/2008 Fischer et al. ............... 430/314
2009/0130852 A1 * 5/2009 Kewley ....................... 438/694

* cited by examiner

*Primary Examiner* — Thanhha Pham
(74) *Attorney, Agent, or Firm* — Williams, Morgan & Amerson, P.C.

(57) ABSTRACT

A method for forming an interconnect structure includes forming a mandrel above a base layer, forming spacers on the mandrel, forming recesses in the base layer using the spacers as an etch template, and forming a conductive material in the recesses.

23 Claims, 9 Drawing Sheets

METHOD FOR FORMING AN INTERCONNECT STRUCTURE

CROSS-REFERENCE TO RELATED APPLICATIONS

Not applicable.

BACKGROUND

The disclosed subject matter relates generally to semiconductor device manufacturing and, more particularly, to a method and apparatus for performing double exposure photolithography using a single reticle.

Semiconductor devices, or microchips, are manufactured from wafers of a substrate material. Layers of materials are added, removed, and/or treated during fabrication to create the integrated, electrical circuits that make up the device. The fabrication essentially comprises four operations: layering, or adding thin layers of various materials to a wafer from which a semiconductor is produced; patterning, or removing selected portions of added layers; doping, or placing specific amounts of dopants in the wafer surface through openings in the added layers; and heat treatment, or heating and cooling the materials to produce desired effects in the processed wafer. Although there are only four basic operations, they can be combined in hundreds of different ways, depending upon the particular fabrication process.

The fabrication process generally involves processing a number of wafers through a series of fabrication tools. Each fabrication tool performs one or more of the four basic operations. The four basic operations are performed in accordance with an overall process to finally produce wafers from which the semiconductor devices are obtained.

Of these four operations, patterning is considered to be an important step. Patterning is known to those in the art by many names. Other names for patterning include photolithography, photomasking, masking, oxide removal, metal removal, and microlithography. The term "photolithography" will hereafter be used to refer to patterning operations. Photolithography typically involves a machine called an "exposure tool," or sometimes also called a "stepper" or a "scanner". An exposure tool positions a portion of a wafer being processed under a "photomask." The photomask is usually a reticle, which is a copy of a pattern created in a layer of chrome on a glass plate. Light is then transmitted through the reticle onto a thin layer of material called photoresist previously added to the wafer. The chrome blocks the light while the glass allows it to pass.

The light shining through the pattern on the reticle creates an aerial image which, when interfacing with the photoresist at the optimum focal plane, changes the material characteristics of the photoresist where it shines. In essence, this allows the pattern on the reticle to be duplicated in, or transferred to, the photoresist. The change in material characteristics makes the photoresist susceptible to removal in the subsequent develop operation prior to the next sequential process step such as etching or ion implantation. The exposure tool then positions another portion of the wafer under the reticle, and the pattern transfer is repeated. The process is repeated until the entire wafer has completed the pattern transfer operation. This process of shining light through a photomask to treat a photoresist is known as "exposure," or "pattern transfer."

The reticle described in the example above is more precisely known as a "binary mask" because each portion of the reticle either transmits all the light or blocks all the light. However, ever-decreasing feature sizes have created problems for binary masks. The light shining through the chrome pattern scatters at the edges of the chrome traces, with undesirable effects on the pattern transfer process to the photoresist. The smaller the feature sizes, the more acute the problem.

Another type of photomask is a "phase shift" photomask. There are a variety of phase shift photomask types, but all shift the phase of the light waves so that the projected image of the photomask has an improvement of one or more image characteristics (e.g., contrast, edge definition, etc.) as compared with the same pattern from a binary photomask. An attenuated phase shift photomask, for instance, comprises a reticle that attenuates and phase-shifts the light wave in the "dark" regions of the photomask so that the contrast between bright and dark regions of the image is improved. Since, the transmission function of such a photomask cannot be described in simple terms of "bright" or "dark," this type of mask is not considered "binary." A complementary phase shift photomask actually comprises two reticles, where, at most, only one of which can be binary. The first (i.e., typically binary) is used to define an exposure area and to expose noncritical features, and the second (i.e., typically phase-shifting) is used to expose the critical features in a second pass. Both passes are performed before the wafer is stepped to process another portion of the wafer so that the wafers are not exposed, developed, baked, and etched twice.

Optical lithography systems all share a fundamental physical limitation on the minimum pitch (i.e., the center-to-center space of two adjacent features) that can be resolved. This limit is a function of the illumination wavelength and the numerical aperture (NA) of the exposure tool.

One technique for etching features is referred to as spacer double patterning. A template is formed on the layer, and spacers are formed around the template. The template is removed and the material not covered by the spacers is etched away to form the underlying pattern. One limitation of spacer double patterning is that the critical dimension (CD) of the patterned feature is defined by the spacer width. The spacers are formed by depositing a spacer layer of uniform thickness across the wafer. The spacer layer is then etched to form the spacers, where the CD of the spacers is defined by the thickness of the spacer layer. Since the spacer film thickness defines the CD of the circuitry and the spacer film is uniformly deposited across the wafer, it is not feasible to create features having different CDs without using an additional mask for each unique CD. This need for additional masks and the resulting additional photolithography steps makes the use of such a technique not cost-effective.

This section of this document is intended to introduce various aspects of art that may be related to various aspects of the disclosed subject matter described and/or claimed below. This section provides background information to facilitate a better understanding of the various aspects of the disclosed subject matter. It should be understood that the statements in this section of this document are to be read in this light, and not as admissions of prior art. The disclosed subject matter is directed to overcoming, or at least reducing the effects of, one or more of the problems set forth above.

BRIEF SUMMARY

The following presents a simplified summary of the disclosed subject matter in order to provide a basic understanding of some aspects of the disclosed subject matter. This summary is not an exhaustive overview of the disclosed subject matter. It is not intended to identify key or critical elements of the disclosed subject matter or to delineate the scope of the disclosed subject matter. Its sole purpose is to present some concepts in a simplified form as a prelude to the more detailed description that is discussed later.

One aspect of the disclosed subject matter is seen in a method for forming an interconnect structure. The method includes forming a mandrel above a base layer, forming spacers on the mandrel, forming recesses in the base layer using the spacers as an etch template, and forming a conductive material in the recesses.

Another aspect of the disclosed subject matter is seen in method for forming an interconnect structure that includes forming a first mask layer above a dielectric layer. A mandrel is formed above the first mask layer. Spacers are formed on the mandrel. A second mask layer is formed above the mandrel. A block mask is formed above the second mask layer patterned to expose selected regions of the second mask layer. The second mask layer is etched selective to the spacers using the block mask as an etch template to remove portions of the mandrel and the second mask layer exposed by the block mask to define a first pattern in the second mask layer exposing the first mask layer. The first mask layer is etched using the first pattern as an etch template to define a second pattern in the first mask layer exposing the dielectric layer. The dielectric layer is etched using the second pattern as an etch template to define recesses therein. A conductive material is formed in the recesses.

BRIEF DESCRIPTION OF THE SEVERAL VIEWS OF THE DRAWINGS

The disclosed subject matter will hereafter be described with reference to the accompanying drawings, wherein like reference numerals denote like elements, and.

Figure 1A:
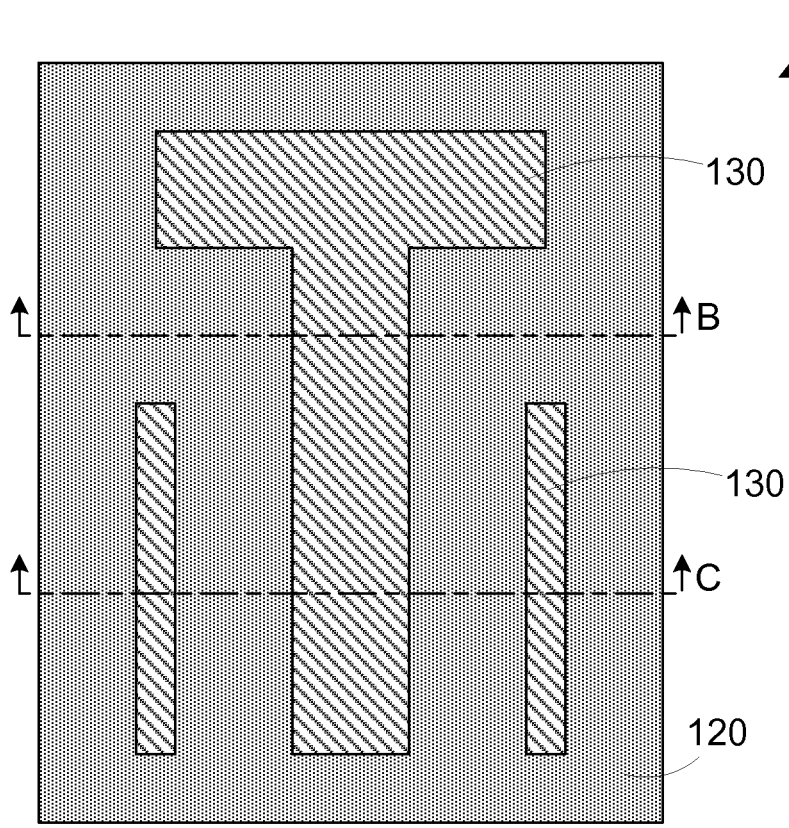
FIGS. 1a-1c are top and cross-section views of a semiconductor device having a mandrel formed thereon to define an interconnect template.

While the disclosed subject matter is susceptible to various modifications and alternative forms, specific embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the spirit and scope of the disclosed subject matter as defined by the appended claims.

DETAILED DESCRIPTION

One or more specific embodiments of the disclosed subject matter will be described below. It is specifically intended that the disclosed subject matter not be limited to the embodiments and illustrations contained herein, but include modified forms of those embodiments including portions of the embodiments and combinations of elements of different embodiments as come within the scope of the following claims. It should be appreciated that in the development of any such actual implementation, as in any engineering or design project, numerous implementation-specific decisions must be made to achieve the developers' specific goals, such as compliance with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the disclosed subject matter unless explicitly indicated as being "critical" or "essential."

The disclosed subject matter will now be described with reference to the attached figures. Various structures, systems and devices are schematically depicted in the drawings for purposes of explanation only and so as to not obscure the disclosed subject matter with details that are well known to those skilled in the art. Nevertheless, the attached drawings are included to describe and explain illustrative examples of the disclosed subject matter. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 1B:
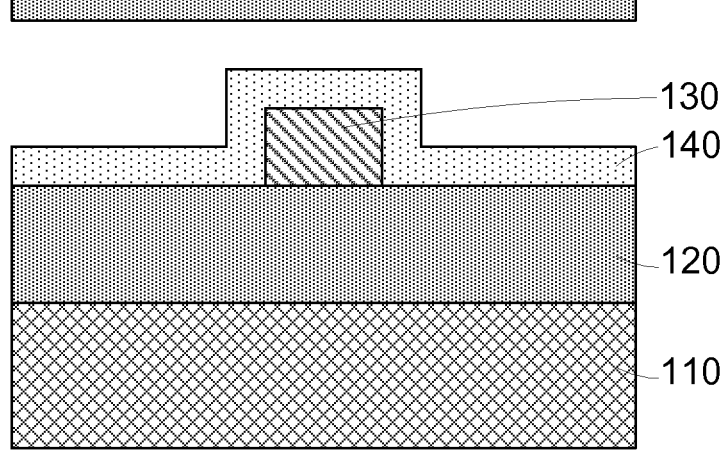
Figure 1C:
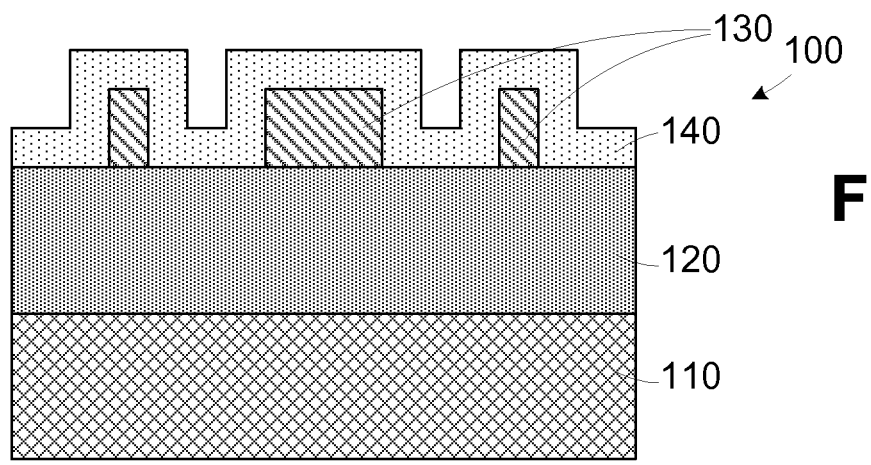

Referring now to the drawings wherein like reference numbers correspond to similar components throughout the several views, the disclosed subject matter shall be described in the context of a method for forming metal interconnect structures in a semiconductor device 100. As shown in FIGS. 1a-1c, a base layer 110 is formed on a substrate. As will be described below, the base layer 110 is to be patterned with trenches and filled with metal for forming interconnect structures. A bottom anti-reflective coating (BARC) 120 is formed above the base layer 110 to assist in patterning. Although the BARC 120 is illustrated as a single layer, it may include multiple layers, such as an upper hard mask layer (e.g., SHB-series coatings from Shin-Etsu MicroSi of Phoenix, Ariz.) and an underlying layer (e.g., AR29 offered by Brewer Science, Inc. of Rolla, Miss.). A mandrel 130 or template is formed above a stack of layers 120 to be patterned. FIGS. 1b and 1c represent cross-section views of the structures shown in FIG. 1a along lines B and C, respectively. As shown in FIGS. 1b and 1c, a spacer layer 140 (omitted from FIG. 1a) is formed above the mandrel 130.

The base layer 110 may be a low-k dielectric material, such as SiCOH, and the mandrel 130 may be formed from photoresist material or another material, such as polysilicon. The spacer layer 140 may be formed from a material that provides etch selectivity with respect to the mandrel 130, such as silicon dioxide, silicon nitride, or a spin-on polymer (e.g., a silicon containing polymer). There are many different materials that may be used for the various layers described herein. The particular materials may varied to provide the necessary etch selectivity characteristics, so that the etch processes described below may be conducted to remove the appropriate layers and mitigating damage to any underlying materials.

Figure 2A:
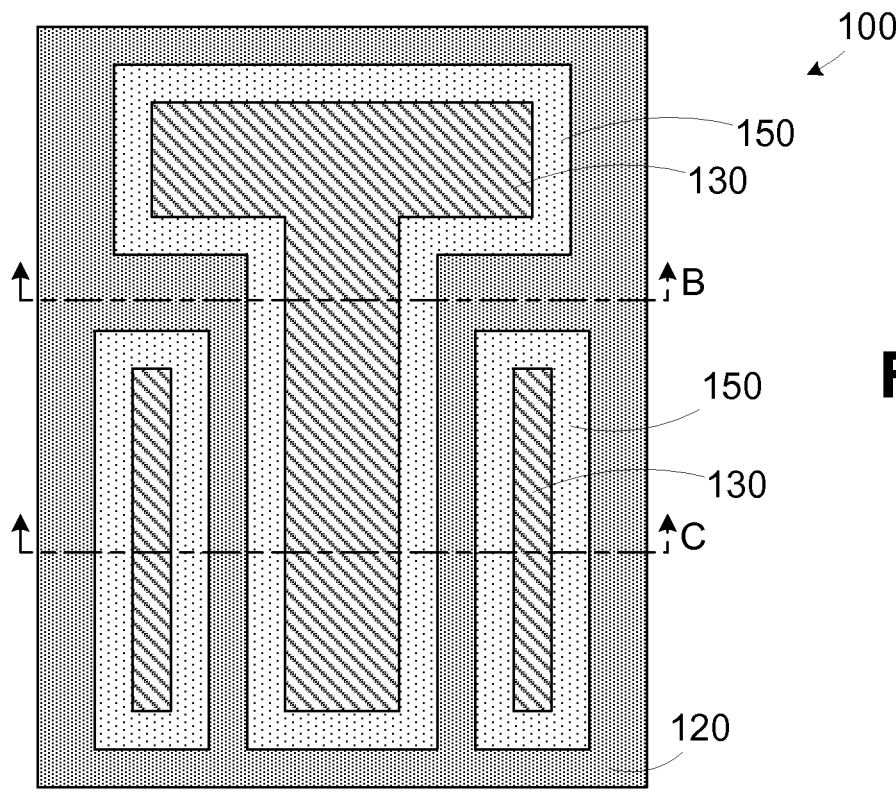
FIGS. 2a-2c are top and cross-section views of the semiconductor device of FIG. 1 with spacer defined on the mandrel.
Figure 2B:
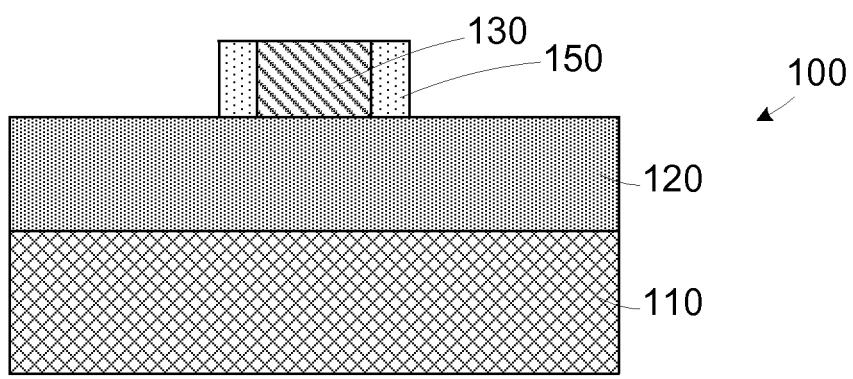
Figure 2C:
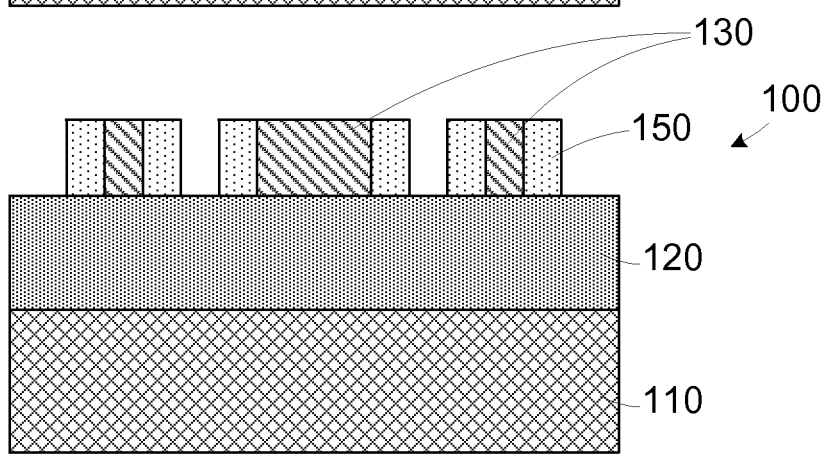

As shown in FIGS. 2a-2c, a spacer etch process is performed create spacers 150 adjacent sidewalls of the mandrel 130. Those of ordinary skill in the art are familiar with appropriate etch chemistries and processes that may be used depending on the materials selected for the layers, such as the mandrel 130 and the spacer layer 140. For ease of illustration, and to avoid obscuring the present subject matter, the details of such etch processes are omitted. Instead, the etch processes are described in terms of their selectivities. Hence, the spacer etch is performed to etch the spacer layer 140 selective to the mandrel 130 to defines the spacers 150.

In the illustrated embodiment, the spacers 150 define an etch template for patterning the BARC 120, which in turn is used to pattern the base layer 110. In other embodiments, the mandrel 130 may be formed directly on the base layer and used in its patterning. As described in greater detail below, the spacers 150 define regions where the underlying base layer 110 will remain during the trench etch. Regions not covered by the spacers 150 (i.e., regions covered by the mandrel 130 and open regions defined between the spacers 150) will be etched to define trenches in the base layer 110 for subsequent filling with conductive material to define interconnect features (i.e., conductive lines).

Figure 3A:
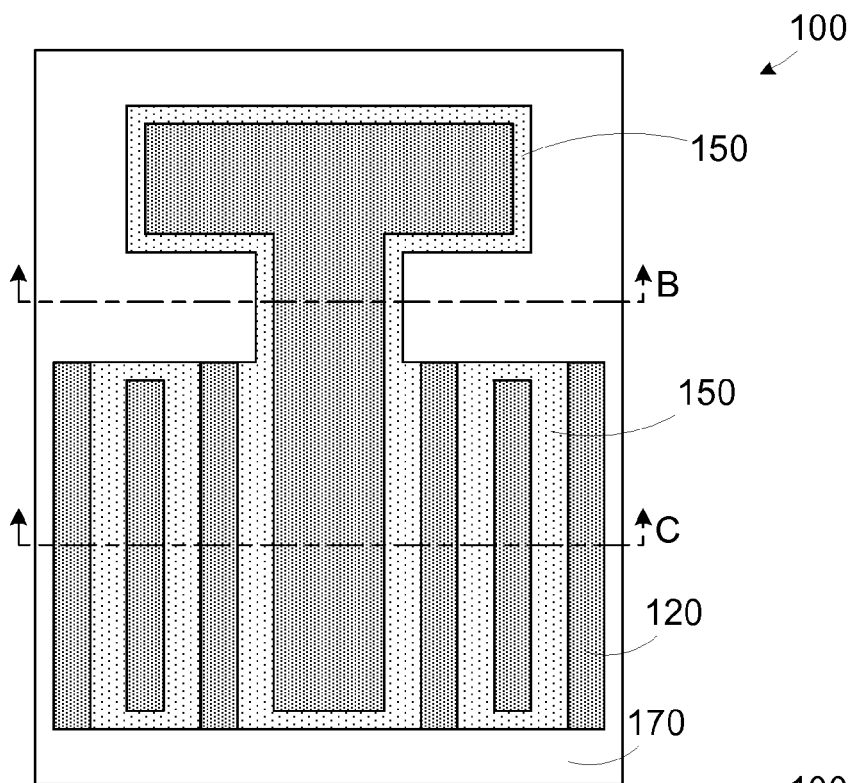
FIGS. 3a-3c are top and cross-section views of the semiconductor device of FIG. 2 with a block mask formed above the mandrel.
Figure 3B:
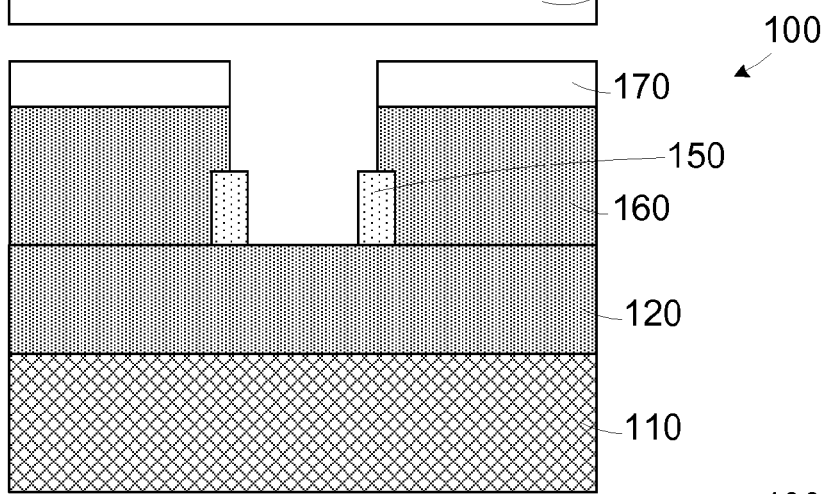
Figure 3C:
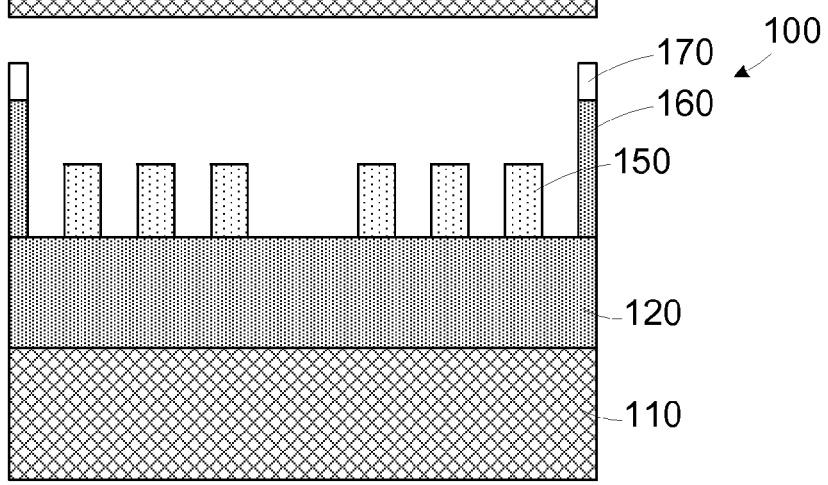

As illustrated in FIGS. 3a-3c, a second BARC 160 is formed above the first BARC 120 and the mandrel 130 with adjacent spacers 150. A block mask 170 (e.g., photoresist) is formed above the BARC 160 and patterned to expose the BARC 160 in accordance with a desired pattern. The BARC 160 is then etched using the block mask 170 to transfer the pattern thereto. The etching process is selective to the material of the spacers 150, such that the BARC 160 and exposed portions of the mandrel 110 are removed. Note that in FIG. 3b, the edges of the block mask 170 are aligned with the middle of the spacer 150 to provide a reduced sensitivity to overlay error.

Figure 4A:
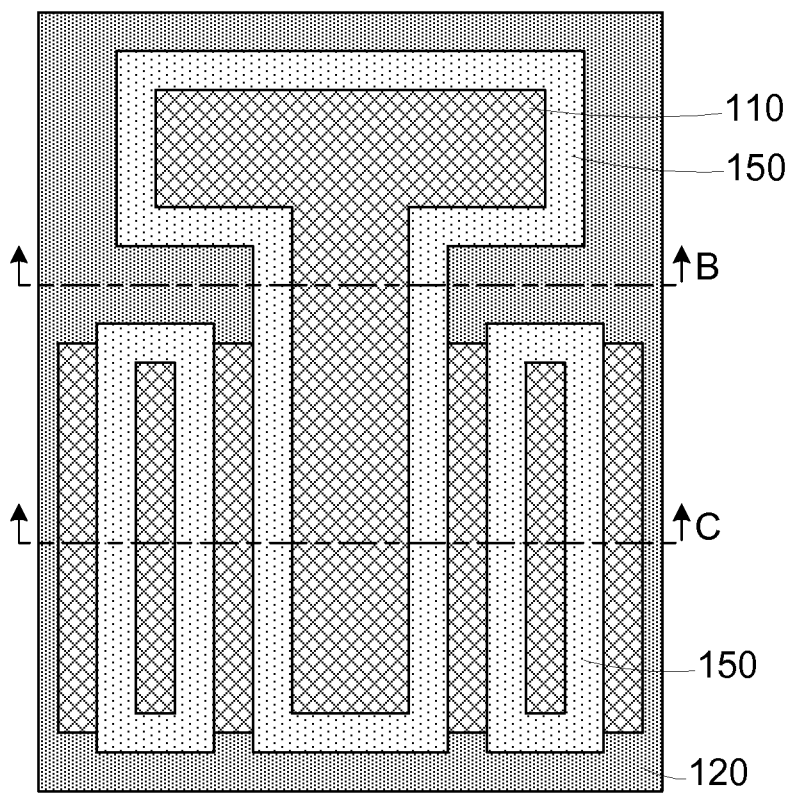
FIGS. 4a-4c are top and cross-section views of the semiconductor device of FIG. 3 where an etch process is performed using the spacers and block mask as an etch template to pattern a mask layer.
Figure 4B:
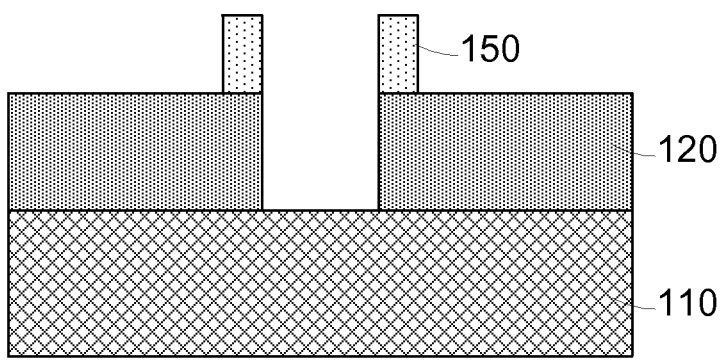
Figure 4C:
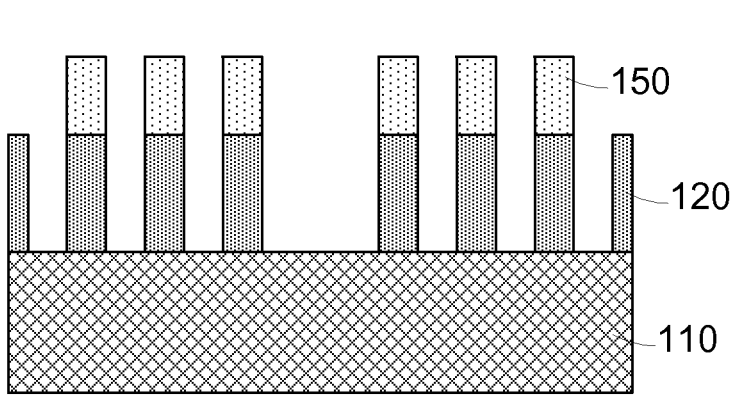

The etch process continues, as shown in FIGS. 4a-4c to transfer the pattern into the BARC 120. In one embodiment, the etch may be non-selective with respect to the spacers 150 such that the spacers 150 are totally or partially consumed during the etching of the BARC 120. In another embodiment, an appropriate wet or dry etch may be used after etching the BARC 120 to selectively remove the spacers 150. The block mask 170 and remaining portions of the BARC 160 may be at least partially consumed during the etching of the BARC 120.

Figure 5A:
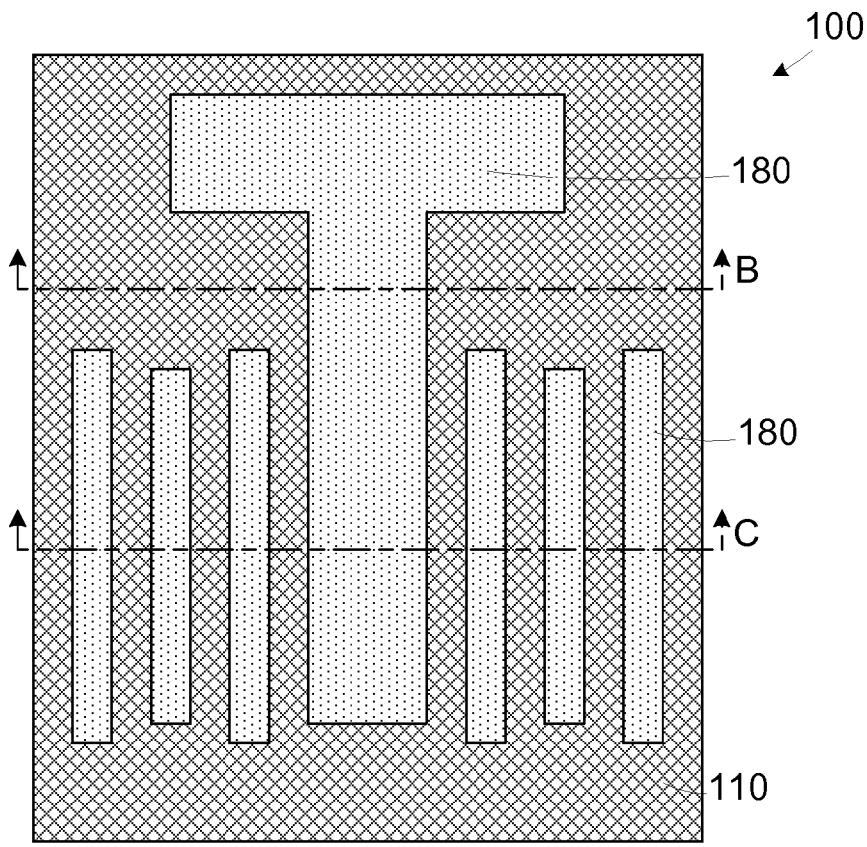
FIGS. 5a-5c are top and cross-section views of the semiconductor device of FIG. 4 where an etch process is performed using the mask layer as an etch template to pattern a base layer.
Figure 5B:
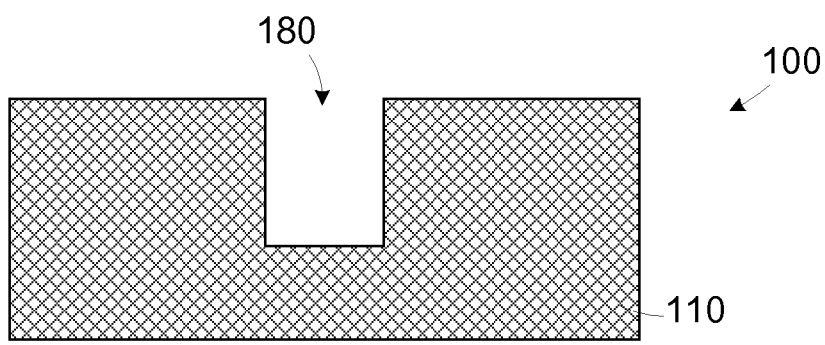
Figure 5C:
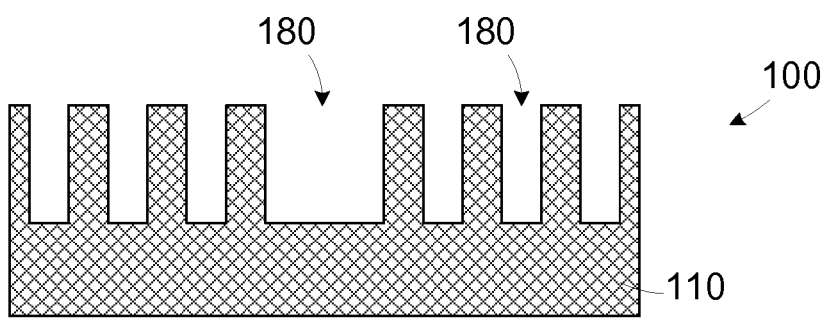

The etching of the base layer 110 is illustrated in FIGS. 5a-5c. The BARC 120 shown in FIG. 4 acts as an etch mask for etching the underlying base layer 110 to define recesses 180 therein. The etch process for forming the recesses 180 may also consume remaining portions of the spacers 150 (i.e., if not previously removed by a selective etch) and portions of the BARC 120. Alternatively, the BARC 120 may be removed after the etching of the base layer 110 by a selective etch. Comparing FIG. 5 to FIG. 2 reveals that the pattern of recesses 180 corresponds to the pattern of mandrel 110 and the spaces defined between the spacers 150. Recesses 180 are also not formed in regions covered by the block mask 170. Hence, the spacers 150 and block mask 170 operate in an additive fashion to define the pattern of recesses 180. That is the recesses 180 are prevented from being formed in the regions covered by the spacers 150 plus the regions covered by the block mask 170.

Figure 6A:
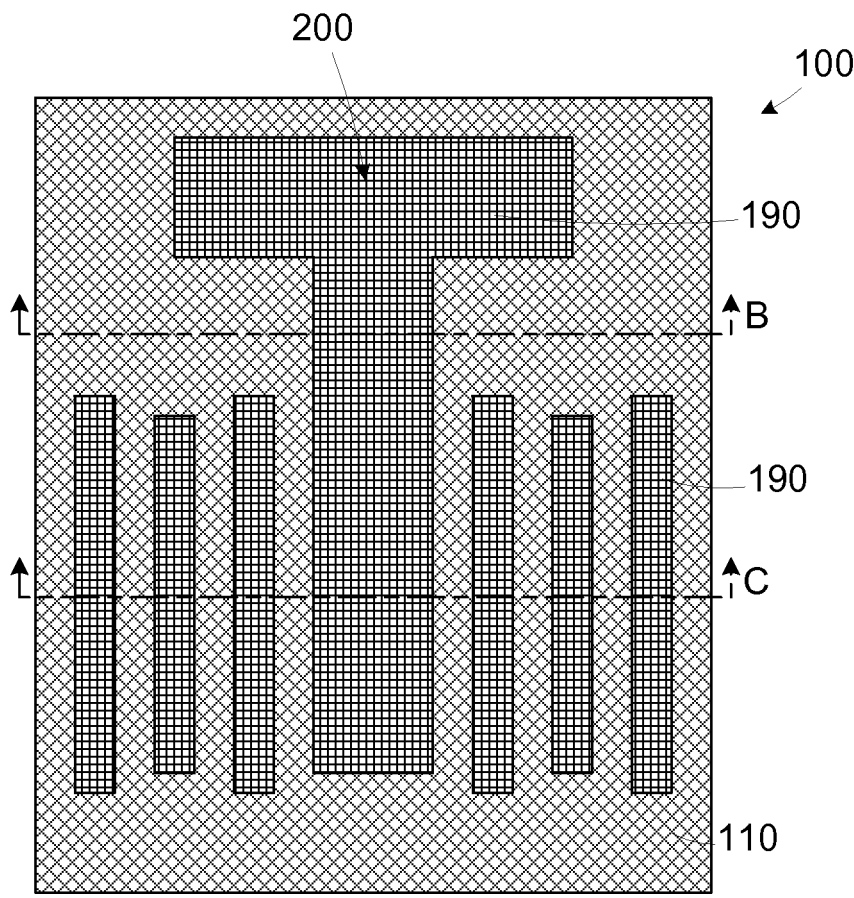
FIGS. 6a-6c are top and cross-section views of the semiconductor device of FIG. 5 where recesses in the base layer are filled with a conductive material.
Figure 6B:
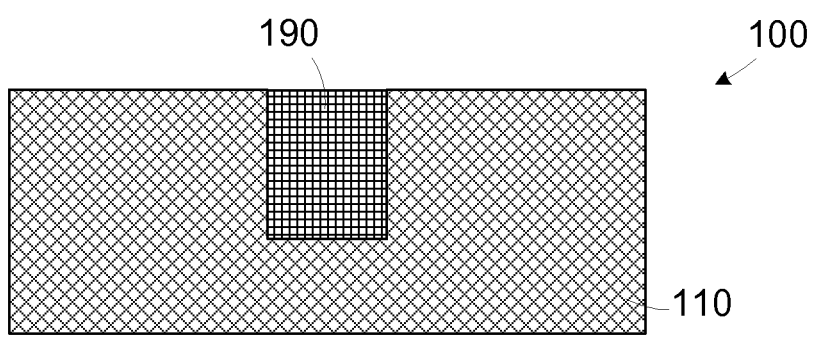
Figure 6C:
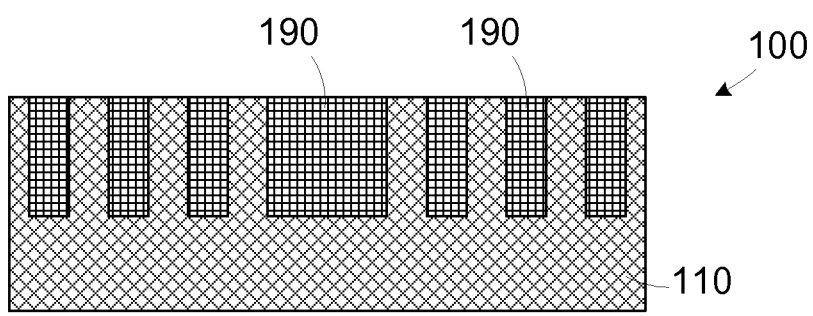

As illustrated in FIGS. 6a-6c, the recesses 180 are filled with a conductive metal 190 to define an interconnect structure 200. Various conductive materials, such as copper, tungsten, aluminum, silicide, polysilicon, etc., may be used depending on the particular type of interconnect structure 200 appropriate for the semiconductor device 100. For example, the conductive material may be deposited or plated and planarized to remove portions extending beyond the recesses 180.

The use of the mandrel 110 and spacers 150 to define the pattern of recesses 180 allows the creation of multiple pitch lines without requiring multiple photolithography processes. The spacers 150 also allow for alignment performance improvements, as the block mask 170 can be aligned to the spacers 150 and small variations in alignment will not change the pattern of recesses 180.

The use of the block mask 170 also provides an opportunity for controlling aspects of the interconnect structure 200, such as tip-to-tip spacing and tip-to-line spacing in a manner that is not dependent on the wavelength limitations of the photolithography processes, and therefore less susceptible to optical proximity effects.

Figure 7A:
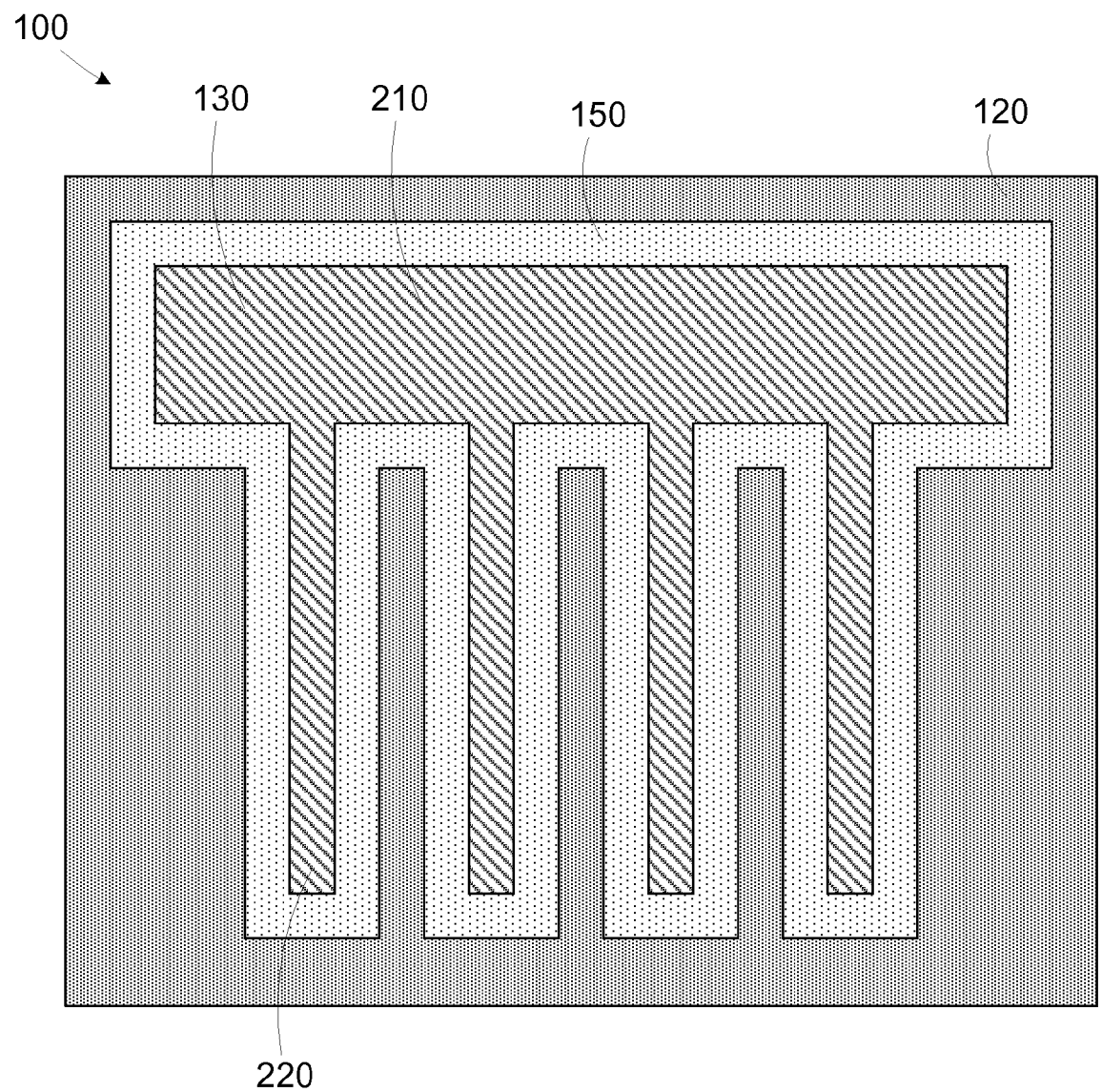
FIGS. 7a-7c are top views of a semiconductor device illustrating the use of a block mask to define tip-to-line and tip-to-tip spacings for an interconnect structure.
Figure 7B:
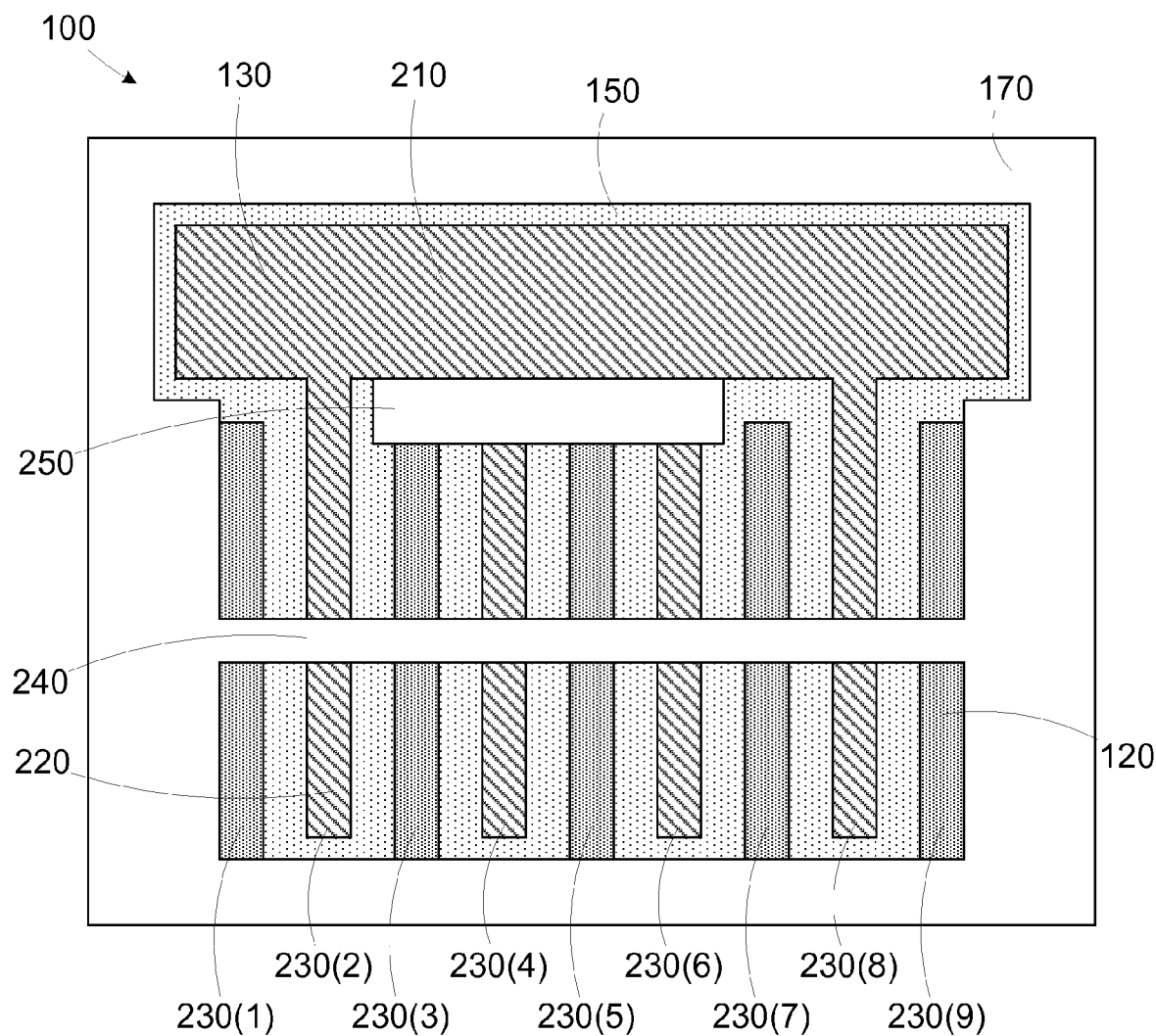
Figure 7C:
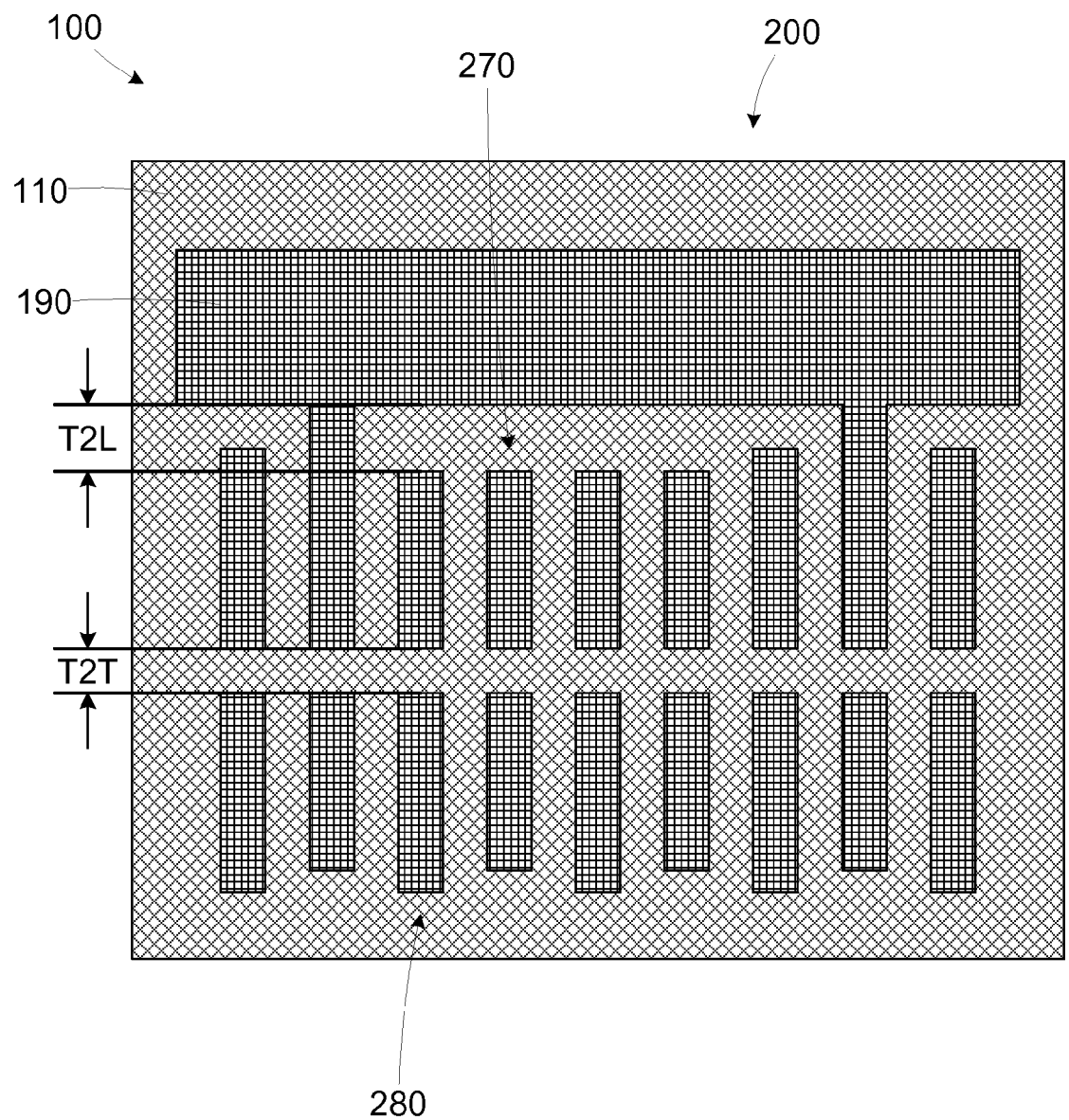

FIGS. 7a-7c illustrate how the block mask 170 may be used to define various spacings in the interconnect structure 200. In FIG. 7a, the mandrel 130 includes a horizontal line 210 and extending fingers 220. As described above the spacers 150 and block mask 170 are additive, so the mandrel 110 and regions defined between the spacers 150 cooperate to define lines 230(1)-(9), as shown in FIG. 7b. The block mask 170 includes a first portion 240 that breaks each line 230(0)-(9) into segments and a second portion 250 that terminates the lines 240(3)-(6) prior to reaching the horizontal line 210.

FIG. 7c shows the completed interconnect structure 200 including a horizontal conductive line 260 and conductive segments 270, 280. Referring back to FIG. 7b, the portion 240 of the block mask 170 was used to define the tip-to-tip (T2T) spacing between the conductive segments 270, 280, and the portion 250 of the block mask 170 was used to define the tip-to-line (T2L) spacing between the conductive line 260 and certain conductive segments 270. Defining the relevant T2L or T2T spacings using the block mask 170 reduces the optical proximity effects of the process and results in a patterned interconnect structure 200 more closely matching the design structure, because corner rounding effects are reduced.

Although the process illustrated herein employs two BARC layers 120, 160 that are patterned to expose the base layer 110, it is contemplated that the process may be modified to cover other embodiments. For example, the mandrel 110 and spacers 150 may be formed directly on the base layer 110 and used as a template for etching the base layer 110 with or without the presence of the block mask 170. In another embodiment, only one BARC layer 120 may be employed. Rather than using a BARC layer 120, 160 other types of hard masks may be employed.

The various shapes for the interconnect structures 200 shown herein are intended to be exemplary. Many different patterns may be defined using the techniques described herein. The flexibility provided by the techniques allows the creation of multiple pitches without multiple masks and the ability to define line spacings with reduced optical proximity effects.

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the disclosed subject matter. Accordingly, the protection sought herein is as set forth in the claims below.

We claim:

1. A method for forming an interconnect structure, comprising:
   forming a mandrel above a base layer;
   forming spacers on the mandrel;
   forming a block mask above the mandrel, the block mask exposing selected regions of the base layer, spacers, and mandrel;
   forming a plurality of recesses in the base layer using the spacers and the block mask as an etch template, wherein at least one of the recesses comprises a first line recess including a first tip, and the block mask defines a spacing between the first tip of the first line recess and another of the recesses; and
   forming a conductive material in the recesses.

2. The method of claim 1, further comprising:
   forming a first mask layer above the base layer;
   forming the mandrel above the first mask layer;
   etching the first mask layer using the spacers as an etch mask to define a pattern in the first mask layer; and
   etching the base layer using the pattern as an etch mask.

3. The method of claim 2, wherein the first mask layer comprises an antireflective coating.

4. The method of claim 1, further comprising:
   forming a second mask layer above the first mask layer and the mandrel;
   forming the block mask above the second mask layer; and
   patterning the block mask to expose selected portions of the second mask layer.

5. The method of claim 4, further comprising etching the second mask layer using the block mask as an etch template.

6. The method of claim 5, further comprising:
   etching the first mask layer and the mandrel selective to the spacers to expose portions of the base layer; and
   etching the exposed portions of the base layer to form the recesses.

7. The method of claim 6, further comprising removing the spacers using a selective etch.

8. The method of claim 6, wherein the second mask layer comprises an antireflective coating.

9. The method of claim 1, wherein the base layer comprises a dielectric layer.

10. The method of claim 1, wherein the first line recess is defined in the base layer between adjacent spacers, the block mask includes a portion covering the base layer to divide the first line recess into first and second segments, wherein the first tip is associated with the first line segment, and a tip-to-tip spacing between the first tip and a second tip of the second line segment is defined by the portion.

11. The method of claim 1, wherein a second line recess is defined in the base layer in a region that was occupied by the mandrel prior to forming the plurality of recesses and the first line recess is defined in the base layer between adjacent spacers, the block mask includes a portion covering the base layer to separate the first line recess and the second line recess, and a tip-to-line spacing between the first tip of the first line recess and the second line recess is defined by the portion.

12. The method of claim 1, wherein an edge of the block mask is aligned along a center portion of at least one of the spacers.

13. The method of claim 1, wherein the recesses are formed in the base layer in regions not covered by the spacers or the block mask.

14. A method for forming an interconnect structure, comprising:
   forming a first mask layer above a dielectric layer;
   forming a mandrel above the first mask layer;
   forming spacers on the mandrel;
   forming a second mask layer above the mandrel;
   forming a block mask above the second mask layer, the block mask being patterned to expose selected regions of the second mask layer;
   etching the second mask layer selective to the spacers using the block mask as an etch template to remove portions of the mandrel and the second mask layer exposed by the block mask to define a first pattern in the second mask layer exposing the first mask layer the first pattern including a first line pattern including a first tip, and the block mask defines a spacing between the first tip of the first line pattern and another pattern in the first pattern;
   etching the first mask layer using the first pattern as an etch template to define a second pattern in the first mask layer exposing the dielectric layer;
   etching the dielectric layer using the second pattern as an etch template to define recesses therein; and
   forming a conductive material in the recesses.

15. The method of claim 14, further comprising removing the spacers.

16. The method of claim 15, wherein the spacers are consumed during at least one of the etching of the second mask layer, the etching of the first mask layer, or the etching of the dielectric layer.

17. The method of claim 15, wherein the spacers are removed using a selective etch.

18. The method of claim 14, wherein an edge of the block mask is aligned along a center portion of at least one of the spacers.

19. The method of claim 14, wherein the first and second mask layers are anti-reflective coatings.

20. The method of claim 14, wherein the first line pattern is defined in the second mask layer between adjacent spacers, the block mask includes a portion covering the second mask layer to divide the first line pattern into first and second segments, wherein the first tip is associated with the first line pattern, and a tip-to-tip spacing between the first tip and a second tip of the second line segment is defined by the portion.

21. The method of claim 14, wherein a second line pattern is defined in the second mask layer in a region that was occupied by the mandrel prior to etching the second mask layer and the first line pattern is defined in the second mask layer between adjacent spacers, the block mask includes a portion covering the second mask layer to separate the first line pattern and the second line pattern, and a tip-to-line spacing between the first tip of the first line pattern and the second line pattern is defined by the portion.

22. A method for forming an interconnect structure, comprising:
   forming a mandrel above a base layer;
   forming spacers on the mandrel;
   forming a block mask above the mandrel, the block mask exposing selected regions of the base layer, spacers, and mandrel, wherein an edge of the block mask is aligned along a center portion of at least one of the spacers;
   forming a plurality of recesses in the base layer using the spacers and the block mask as an etch template; and
   forming a conductive material in the recesses.

23. A method for forming an interconnect structure, comprising:
   forming a first mask layer above a dielectric layer;

forming a mandrel above the first mask layer;
forming spacers on the mandrel;
forming a second mask layer above the mandrel;
forming a block mask above the second mask layer, the block mask being patterned to expose selected regions of the second mask layer, wherein an edge of the block mask is aligned along a center portion of at least one of the spacers;
etching the second mask layer selective to the spacers using the block mask as an etch template to remove portions of the mandrel and the second mask layer exposed by the block mask to define a first pattern in the second mask layer exposing the first mask layer;
etching the first mask layer using the first pattern as an etch template to define a second pattern in the first mask layer exposing the dielectric layer;
etching the dielectric layer using the second pattern as an etch template to define recesses therein; and
forming a conductive material in the recesses.

* * * * *